United States Patent [19]

Anderson

[11] Patent Number: 4,992,756
[45] Date of Patent: Feb. 12, 1991

[54] LOW OFFSET TRANSCONDUCTANCE AMPLIFIER IN AN ANALOG ELECTRONIC COCHLEA

[75] Inventor: David J. Anderson, East Windsor, N.J.

[73] Assignee: Siemens Corporate Research, Inc., Princeton, N.J.

[21] Appl. No.: 365,061

[22] Filed: Jun. 12, 1989

[51] Int. Cl.$^5$ .............................................. H03F 3/45
[52] U.S. Cl. .................................... 330/253; 330/257
[58] Field of Search .................... 330/9, 252, 253, 255, 330/257, 261, 277, 288, 311

[56] References Cited

U.S. PATENT DOCUMENTS

| | | | |
|---|---|---|---|
| 4,371,843 | 2/1983 | Fang et al. | 330/255 X |
| 4,656,437 | 4/1987 | Saari | 330/253 |
| 4,820,998 | 4/1989 | Roessler et al. | 330/253 |
| 4,853,645 | 8/1989 | Seevinck et al. | 330/253 X |

OTHER PUBLICATIONS

Senderowicz et al., A Family of Differential NMOS Analog Circuits for a PCM Codec Filter Chip, IEEE Jour. Solid-State Circ., vol. SC-17 No. 6, Dec. 1982, pp. 1014–1023.
Choi et al., High-Frequency CMOS Switched Capacitor Filters for Communication Applications, ISSCC 83, Feb. 25, 1983, pp. 246, 247, 314.
De La Plaza et al., Power Supply Rejection in Differential Switched-Capacitor Filters, IEEE Jour. Solid-State Cir. Vol. SC-19, No. 6, Dec. 1984, pp. 912–918.
Castello et al., A High-Performance Micropower Switched-Capacitor Filter, IEEE Jour. Solid-State Cir. vol. SC-20, No. 6, Dec. 1985, pp. 1122–1132.
Ribner et al., 80 MHz Low Offset CMOS Fully Differential and Single Ended OP Amps, IEEE Custom Integ. Cir. Conf., 1985, pp. 174–177.
Matsui et al., CMOS Video Filters Using Switched Capacitor 14-MHz Circuits, IEEE Jour. Solid-State Cir., vol. SC-20, No. 6, pp. 1096–1102.
Lyon et al., An analog Electronic Cochlea, IEEE Trans Acous. Speech Sig. Proc., vol. 36, No. 7, Jul. 1988, pp. 1119–1133.
Lyon, Analog VLSI Hearing Systems, VLSI Signal Processing III, 2–4 Nov. 1988, pp. 244–251.
Przytula, A Survey of VLSI Implementations of Artificial Neural Networks, VLSI Signal Processing III, Nov. 2–4, 1988, pp. 221–231.

*Primary Examiner*—Steven Mottola
*Attorney, Agent, or Firm*—Adel A. Ahmed; David N. Caracappa

[57] ABSTRACT

A low offset transconductance amplifier, in an analog electronic cochlea comprises: first and second differentially connected input transistors; an input current source transistor; an output current sink transistor; first means for inducing a current in the output current source transistor in response to the first input transistor; and second means, for inducing a current in the output current sink transistor in response to the second input transistor, including a cascode transistor.

9 Claims, 3 Drawing Sheets

LOW OFFSET TRANSCONDUCTANCE AMPLIFIER IN AN ANALOG ELECTRONIC COCHLEA

The present invention relates to a low offset transconductance amplifier in an analog electronic cochlea which comprises a plurality of serially coupled transmission line stages.

The inner ear, or cochlea, is the interface between sound waves and neural signals. A sound is converted into a hydrodynamic flow within the cochlea by the combined action of the outer and middle ear. In the cochlea, a plurality of hair cells act as hydrodynamic flow/neural transducers. These cells detect the bending motion of hairs, or cilia, in the cochlea caused by the hydrodynamic flow and respond by a change in internal voltage and a release of a neurotransmitter. The function of the cochlea is to house these transducers and to perform a first level of separation, so that each transducer processes a differently filtered version of the sound entering the ear.

The propagation of sound energy as hydrodynamic waves in a fluid is essentially a distributed low-pass filter. The hydrodynamic flow detected by each hair cell is essentially a bandpassfiltered version of the original sound.

An analog electronic cochlea has been described in an article "An Analog Electronic Cochlea", published in the IEEE Transactions on Acoustics, Speech, and Signal Processing, Vol. 36, No. 7, Pages 1119-34, July 1988 by Richard F. Lyon and Carver Mead. FIG. 8 illustrates a floor plan of a 100 stage electronic cochlea chip having 10 output taps. The Q factor for each of the 100 stages is fixed by signals from sources external to the chip. FIG. 7 illustrates a second-order filter section which was used as one stage in the 100 stage cochlea. This second-order filter section includes three amplifier circuits. FIG. 5 illustrates a basic and a wide-range CMOS transconductance amplifier circuit which was used in the second-order filter section illustrated in FIG. 7.

In the biological cochlea, the response of each hair cell varies in response to the output of that cell. In particular, the output of a hair cell is reduced by the presence of a steady state signal which invokes a response from that hair cell, a process known as adaptation. This provides a protection mechanism for high-level sounds. In addition, the biological cochlea includes other hair cells, called outer hair cells, which reinforce the hydrodynamic flow if it is below some level. This essentially provides amplification for low-level sounds.

Because a large number of transmission line stages, each including several cascaded transconductance amplifiers, are connected in series in an analog electronic cochlea, it is desireable that the offset introduced by the stages be minimized.

In accordance with principles of the present invention, a low offset transmission line stage, in an analog electronic cochlea including a plurality of serially coupled transmission line stages, comprises: first and second differentially connected input transistors; an output current source transistor; an output current sink transistor; first means for inducing a current in the output current source transistor in response to the first input transistor; and second means, for inducing a current in the output current sink transistor in response to the second input transistor, including a cascode transistor.

Figure 1:
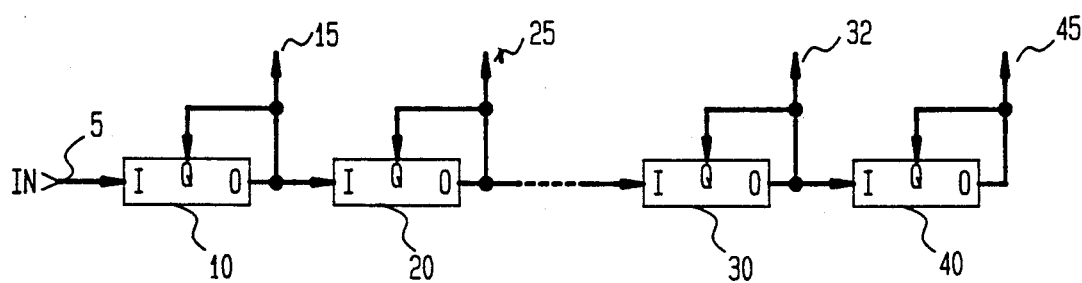
FIG. 1 is a block diagram of an electronic cochlea embodying the present invention.

FIG. 1 illustrates an embodiment of an electronic cochlea according to principles of the present invention. In FIG. 1, a source (not shown) of a sound representative signal is coupled to an input terminal 5. Input terminal 5 is coupled to an input terminal of a plurality of series coupled transmission line stages 10–40. Each of the transmission line stages 10–40 include a signal input terminal I, a signal output terminal O and a Q control input terminal Q. The output terminals O of each of the transmission line stages 10–40 are coupled to the Q control input terminal of that transmission line stage and to a corresponding output terminal 15–45, of the electronic cochlea. Output terminals 15–45 may be coupled to utilization circuitry (not shown) for analyzing the output signals. More transmission line stages may be coupled between the input terminal 5 and the output terminal 45, as indicated by the break between transmission line stages 20 and 30.

In operation, the series connection of transmission line stages 10–40 operate in a known manner, as described above with respect to the Lyon and Mead article. The difference is that the output of each transmission line stage is fed back to the Q control input terminal of that stage. This provides the desired adaptive behavior of each transmission line stage.

Figure 2:
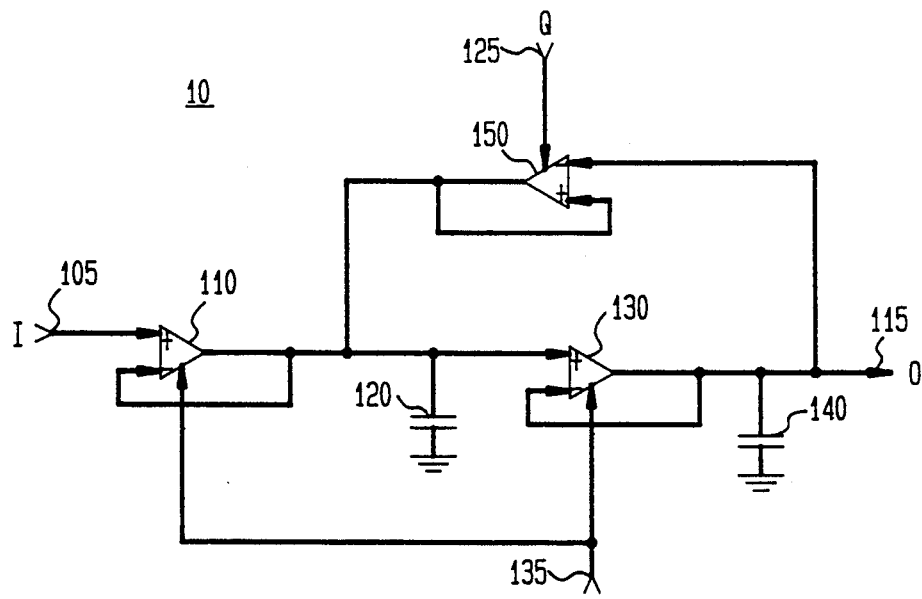
FIG. 2 is a schematic diagram of one stage which may be used in the electronic cochlea illustrated in FIG. 1.

FIG. 2 illustrates a schematic diagram of one transmission line stage used in the analog electronic cochlea illustrated in FIG. 1. In FIG. 2, an input terminal 105, receiving an input signal I is coupled to a non-inverting input terminal (+) of a first amplifier 110. An output terminal of the first amplifier 110 is coupled to an inverting input terminal (−) of the first amplifier 110, to a first electrode of a first capacitor 120 and to a non-inverting input terminal (+) of a second amplifier 130. An output terminal of the second amplifier 130 is coupled to an inverting input terminal (−) of the second amplifier 130, to a first electrode of a second capacitor 140, to an output terminal 115, which produces an output signal O, and to an inverting input terminal (−) of a third amplifier 150. An output terminal of the third amplifier is coupled to a non-inverting input terminal (+) of the third amplifier 150, and to the non-inverting input terminal (+) of the second amplifier 130. The second electrodes of the first and second capacitor are coupled to ground.

A first control input terminal 135 is coupled to a source (not shown) of a user signal τ. Input terminal 135 is coupled to control input terminals of first and second amplifiers 110 and 130 respectively. A second control input terminal 125 is coupled to the Q input terminal of the transmission line stage (FIG. 1). The second control input terminal 125 is coupled to a control input terminal of the third amplifier 150.

In operation, the transmission line stage 10 operates, in a known manner, as a second-order low pass filter section. The value $1/\tau = N$ is the natural frequency of the stage. Thus, if a different value signal $\tau$ from control input terminal 135 is presented to the different stages of the analog electronic cochlea, each stage will respond to a different natural frequency. The response of each stage is relatively flat until the region around natural frequency, then the response declines at 6 dB per octave.

In a known manner, a voltage divider (not shown) has a plurality of successive uniformly distributed taps coupled to the respective $\tau$ input terminals of corresponding successive transmission line stages. The end terminals of the voltage divider are coupled across the terminals of a voltage source thus conditioning the successive transmission line stages to respond to a range of exponentially distributed natural frequencies.

The Q input terminal 125 provides a signal which controls the amount of peaking at the natural frequency N for each stage 10. In a preferred embodiment, the Q value of less than 1.0 is used. This makes the peak of the single-stage response relatively broad with a maximum value slightly greater than unity. In the circuit described in the above article by Lyon and Mead, the value of the Q signal for the successive transmission line stages is set by an additional voltage divider with a plurality of successive uniformly distributed taps coupled to the Q input terminals of corresponding successive transmission line stages. In the present invention, the Q of each transmission line stage is responsive to the output signal of that stage. The Q of a stage is reduced in response to the presence of an output signal from the stage for a relatively long period of time. This is the process called adaptation, described above. Circuitry for implementing this adaptive Q selection will be described in more detail below.

Figure 3:
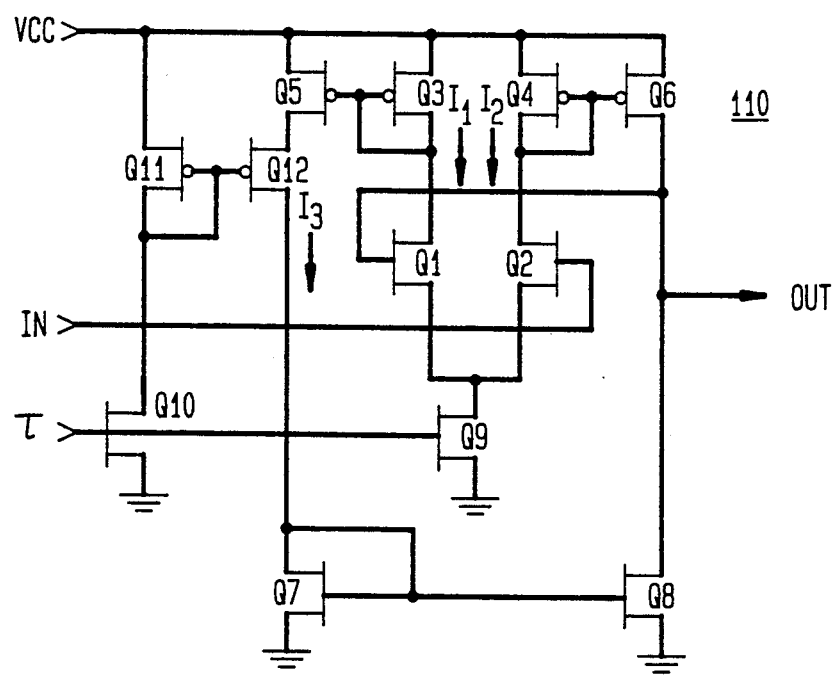
FIG. 3 is a schematic diagram of an amplifier which may be used in the stage of the electronic cochlea illustrated in FIG. 2.

FIG. 3 is a schematic diagram of an amplifier 110 which may be used in the transmission line stage illustrated in FIG. 2. In the following Figures, a p-channel transistor is represented by a transistor symbol with a small circle at the control electrode. An n-channel transistor is represented by a transistor symbol without the small circle at the control electrode. In FIG. 3, a series connection of the main conduction paths of a p-channel transistor $Q_4$ and an n-channel transistor $Q_2$ is coupled in parallel with a series connection of the main conduction paths of a p-channel transistor $Q_3$ and an n-channel transistor $Q_1$. This parallel circuit is coupled in series with the main conduction path of an n-channel transistor $Q_9$ between a source of operating potential $V_{cc}$ and ground. A series connection of the main conduction paths of a p-channel transistor $Q_6$ and an n-channel transistor $Q_8$ is coupled between the source of operating potential $V_{cc}$ and ground; and a series connection of the main conduction paths of p-channel transistors $Q_5$ and $Q_{12}$ and an n-channel transistor $Q_7$ is coupled between the source of operating potential $V_{cc}$ and ground. A series connection of the main conduction paths of a p-channel transistor $Q_{11}$ and an n-channel transistor $Q_{10}$ is coupled between the source of operating potential and ground.

An input terminal IN of amplifier 110 forms the non-inverting input terminal of the transconductance amplifier 110, and is coupled to a control electrode of transistor $Q_2$. The junction of the main conduction paths of transistors $Q_6$ and $Q_8$ is coupled to a control electrode of transistor $Q_1$ and to an output terminal OUT, which forms the output terminal of the transconductance amplifier 110. The junction of the main conduction paths of transistors $Q_4$ and $Q_2$ is coupled to control electrodes of transistors $Q_4$ and $Q_6$ respectively; and the junction of the main conduction paths of transistors $Q_3$ and $Q_1$ is coupled to control electrodes of transistors $Q_3$ and $Q_5$, respectively. The junction of the main conduction paths of transistors $Q_{12}$ and $Q_7$ is coupled to control electrodes of transistors $Q_7$ and $Q_8$, respectively. The junction of the main conduction paths of transistors $Q_{11}$ and $Q_{10}$ is coupled to control electrodes of transistors $Q_{11}$ and $Q_{12}$, respectively. A bias control input terminal $\tau$ is coupled to control electrodes of transistors $Q_{10}$ and $Q_9$, respectively.

Transistors $Q_1$ to $Q_9$ form a transconductance amplifier of a known type, as illustrated in the Lyon and Mead article, described above, and operates in a known manner. Transistors $Q_1$ and $Q_2$ form a differentially connected input transistor pair. Transistor $Q_6$ is an output current source transistor, and transistor $Q_8$ is an output current sink transistor. Transistor $Q_4$ acts as a current mirror with transistor $Q_6$ so as to induce a current in transistor $Q_6$ which is proportional to the current passing through input transistor $Q_2$. Transistors $Q_3$, $Q_5$, $Q_{12}$ and $Q_7$, in combination, induce a current in transistor $Q_8$ which is proportional to the current passing through input transistor $Q_1$. Transistor $Q_{12}$ operates as a cascode transistor in a manner described below. Transistors $Q_3$ and $Q_5$ operate as a current mirror to induce a current proportional to that passing through transistors $Q_3$ and $Q_1$ in a current path formed by transistors $Q_5$, $Q_{12}$, and $Q_7$. Transistor $Q_7$ acts as a current mirror in combination with transistor $Q_8$ to pass a current proportional to that in the current path in transistor $Q_8$. Transistors $Q_{11}$ and $Q_{10}$ are a bias source for transistors $Q_{12}$.

In such an amplifier a double ended voltage input signal produces an amplified current output signal. (The inverting input terminal of the amplifier is the control electrode of transistor $Q_1$, and is coupled to the output terminal of the transconductance amplifier, as illustrated in FIG. 2.) If the voltage at the inverting input terminal is equal to the voltage at the non-inverting input terminal, then ideally, the current $I_1$, flowing through the main conduction paths of transistors $Q_3$ and $Q_1$, equals the current $I_2$, flowing through the main conduction paths of transistors $Q_4$ and $Q_2$. Under this condition, the output current should be zero, because the current sourced by transistor $Q_6$ will be equal to the current sunk by transistor $Q_8$. Even if $I_1$ is equal to $I_2$, due to ideal matching of the transistors, there will be an offset current at the output terminal OUT due to an inequality of the current $I_1$ and current $I_3$, flowing through the main conduction paths of transistors $Q_5$, $Q_{12}$ and $Q_7$. This inequality occurs because of the differing bias conditions of transistors $Q_3$ and $Q_5$. The transistor $Q_{12}$ cascodes $Q_5$ and thereby greatly increases the matching of $I_1$ and $I_3$. This reduces the offset current, which is critical in a delay line including many sections, such as illustrated in FIG. 1. In addition, bias transistors $Q_{11}$ and $Q_{10}$ may be shared among several amplifiers. For example, in FIG. 2, both amplifiers 110 and 130 may be constructed as illustrated in FIG. 3, and may share bias transistors $Q_{11}$ and $Q_{10}$.

Figure 4:
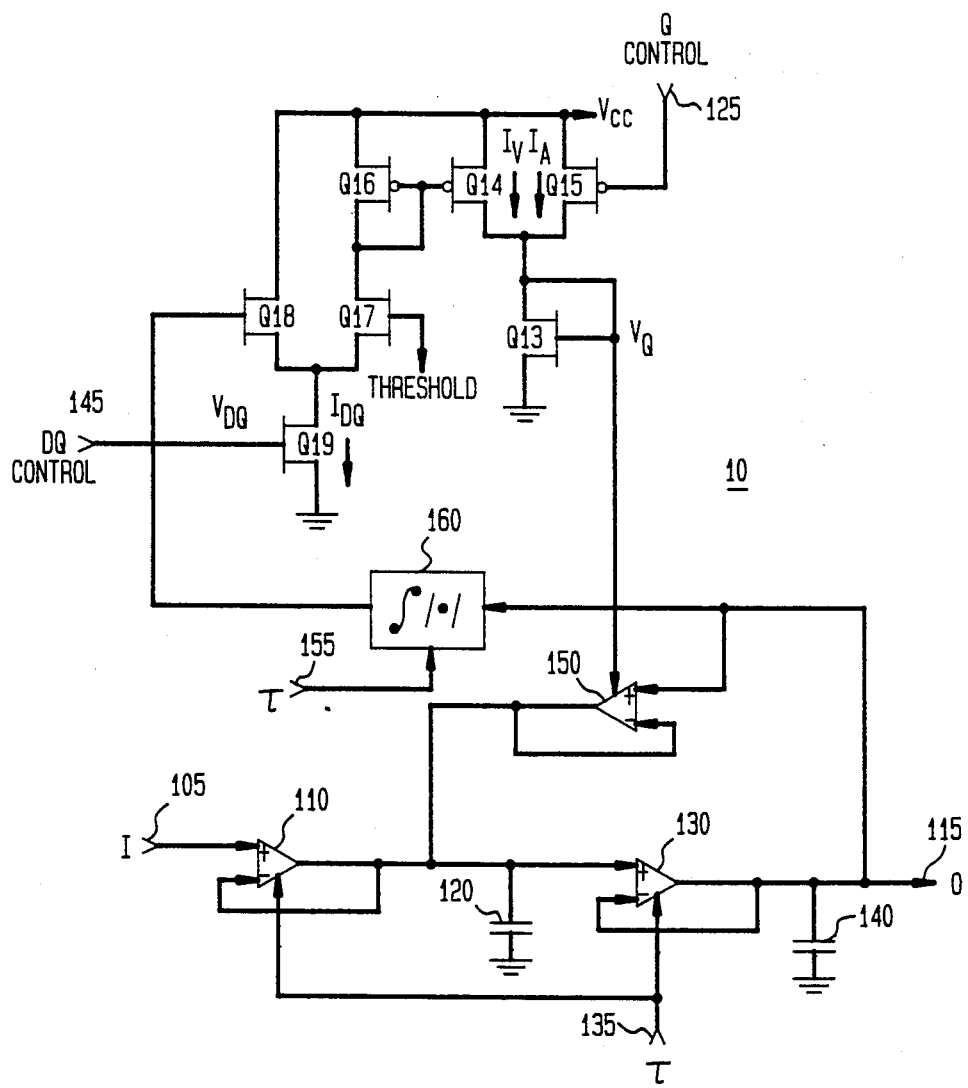
FIG. 4 is a schematic diagram of another embodiment of one stage which may be used in the electronic cochlea illustrated in FIG. 1.

FIG. 4 illustrates an adaptive transmission line stage 10 which may be used in the electronic cochlea illustrated in FIG. 1. In FIG. 4, elements identical to elements illustrated in FIG. 2 are denoted by the same reference number and are not described in detail below. In FIG. 4, the output terminal 115 of the transmission line stage 10 is coupled to an input terminal of an energy detector circuit 160. A time-constant input terminal 155, coupled to a source (not shown) of a time-constant signal $\tau'$, is coupled to a control input terminal of the energy detector circuit 160.

A main conduction path of a p-channel transistor $Q_{14}$ is coupled in parallel with a main conduction path of a p-channel transistor $Q_{15}$. This parallel circuit is coupled in series with a main conduction path of an n-channel transistor $Q_{13}$ between a source of operating potential $V_{cc}$ and ground. A series connection of a main conduction path of a p-channel transistor $Q_{16}$ and a main conduction path of an n-channel transistor $Q_{17}$ is coupled in parallel with a main conduction path of an n-channel transistor $Q_{18}$. This parallel circuit is coupled in series with a main conduction path of an n-channel transistor $Q_{19}$ between the source of operating potential $V_{cc}$ and ground.

An output terminal of the energy detector circuit 160 is coupled to a control electrode of transistor $Q_{18}$. A Q control input terminal 125' (which may, for example, be coupled to a tap of a voltage divider (not shown) as described above) is coupled to a control electrode of transistor $Q_{15}$. A DQ control input terminal 145 (which may also be coupled to a tap of a voltage divider (not shown)) is coupled to a control electrode of transistor $Q_{19}$. The junction of the main conduction paths of transistors $Q_{16}$ and $Q_{17}$ is coupled to the control electrodes of transistors $Q_{16}$ and $Q_{14}$. The junction of the parallel circuit consisting of transistors $Q_{14}$ and $Q_{15}$, and the main conduction path of transistor $Q_{13}$ is coupled to the control electrode of transistor $Q_{13}$ and the control input terminal of amplifier 150. A control electrode of transistor $Q_{17}$ is coupled to a source (not shown) of a threshold signal.

In operation, the adaptation is based on the energy level in the output signal from the transmission line stage. Thus, each stage modifies its own Q, based upon the energy in its output signal. This may be done by rectifying the output signal and then integrating it. This is done by energy detector circuit 160 which may be constructed in a known manner. The output of energy detector circuit 160 is a signal that has a value representative of the signal energy at the natural frequency N of the transmission line stage 10. The integration time may be set by the bias current in the integrator in response to the time-constant signal $\tau'$. The energy representative signal may by used to set the bias current of the feedback amplifier 150.

The Q control signal at input terminal 125' conditions transistor $Q_{15}$ to pass a Q bias current signal $I_Q$. The voltage $V_{B1}$ of the DQ control signal from input terminal 145 conditions transistor $Q_{19}$ to pass a DQ bias current signal $I_{DQ}$. Transistors $Q_{18}$ and $Q_{17}$, in combination, pass the DQ bias current $I_{DQ}$. If the signal at the control electrode of transistor $Q_{18}$ is 0, indicating that no signal energy is present at the output of the transmission line stage 10, then transistor $Q_{17}$ passes all of the DQ bias current $I_{DQ}$. When the voltage signal from the energy detector circuit 160 exceeds the threshold voltage at the control electrode of transistor $Q_{17}$, then transistor $Q_{18}$ begins to conduct. Because transistor $Q_{19}$ passes a constant amount of bias current $I_{DQ}$, the amount of current passed by transistor $Q_{17}$ is decreased by the amount of current passed by transistor $Q_{18}$. As the amount of detected energy in the output signal of the transmission line stage 10 increases, the amount of current passed by transistor $Q_{17}$ decreases.

Transistors $Q_{16}$ and $Q_{14}$ act as a current mirror so that transistor $Q_{14}$ passes the same current as transistor $Q_{16}$. Transistor $Q_{14}$, thus, passes a variable current signal $I_v$ which decreases in response to increasing detected signal energy. Transistor $Q_{13}$ passes the sum of the Q bias current signal $I_Q$ and the variable current signal $I_v$ and produces a Q control voltage signal $V_Q$. The Q control voltage signal $V_Q$ controls the current in the feedback amplifier 150. This in turn reduces the control current to feedback amplifier 150, thus reducing the Q of the low pass filter and thus the peaking of the transmission line stage 10.

The Q control signal at input terminal 125' controls the minimum Q which the low pass filter section in the transmission line stage can exhibit, while the DQ control signal at input terminal 145 controls the value of Q above that minimum which the low pass filter section in the transmission line stage can exhibit. The threshold signal controls a minimum energy level above which the output signal from the transmission line stage must rise before the Q of the low pass filter begins to lower.

What I claim is:

1. A low offset transconductance amplifier comprising:
   first and second differentially connected input transistors;
   an output current source transistor;
   an output current sink transistor;
   first means for inducing a current in said output current source transistor in response to said first input transistor, said first input transistor having a main conduction path, and said first current inducing means comprising a current mirror including a first current mirror transistor having a main conduction path coupled in series with said main conduction path of said first input transistor, and the junction of said main conduction paths of said first input transistor and said first current mirror transistor being coupled to control electrodes of said first current mirror transistor and said output current source transistor; and
   second means for inducing a current in said output current sink transistor in response to said second input transistor, including a cascode transistor.

2. A low offset transconductance amplifier comprising:
   first and second differentially connected input transistors;
   an output current source transistor;
   an output current sink transistor;
   first means for inducing a current in said output current source transistor in response to said first input transistor; and
   second means for inducing a current in said output current sink transistor in response to said second input transistor, including a cascode transistor,
   wherein said second current inducing means comprises:
   a first current mirror for coupling said second input transistor to a first current path;
   said cascode transistor, having a main conduction path coupled in said first current path; and
   a second current mirror for coupling said current path to said output current sink transistor.

3. The amplifier of claim 2, wherein:

said second input transistor has a main conduction path; and said first current mirror includes: a first transistor, having a main conduction path coupled in series with said main conduction path of said second input transistor; and a second transistor, having a main conduction path coupled in said first current path; wherein the junction of said main conduction paths of said second input transistor and said first transistor of said first current mirror is coupled to control electrodes of said first and second transistors of said first current mirror; and said second current mirror includes: a first transistor, having a main conduction path coupled in said first current path; and said output current sink transistor; wherein the junction of said main conduction paths of said cascode transistor and said first transistor of said second current mirror is coupled to control electrodes of said first transistor of said second current mirror, and said output current sink transistor.

4. The amplifier of claim 2, wherein said first current inducing means comprises a third current mirror for coupling said first input transistor to said output current source transistor.

5. The amplifier of claim 4, wherein:

said first input transistor has a main conduction path; and said third current mirror includes: a first transistor, having a main conduction path coupled in series with said main conduction path of said first input transistor; and said output current source transistor; wherein the junction of said main conduction paths of said first transistor of said third current mirror and said first input transistor is coupled to control electrodes of said first transistor of said third current mirror and said other one of said input transistors.

6. A low offset transconductance amplifier comprising:

first and second differentially connected input transistors;

an output current source transistor;

an output current sink transistor;

first means for inducing a current in said output current source transistor in response to said fist input transistor;

second means for inducing a current in said output current sink transistor in response to said second input transistor, including a cascode transistor; and a bias source coupled to said cascode transistor, wherein said bias source comprises a first and a second transistor having respective main conduction paths serially coupled between a source of operating potential and a source of reference potential; and wherein the junction of said main conduction paths of said first and second bias transistors is coupled to control electrodes of said first bias transistor and said cascode transistor.

7. The amplifier of claim 6, further including:

a current setting transistor, having a main conduction path serially coupled with said differentially connected input transistors between said source of operating potential and said source of reference potential; wherein:

a source of bias control signal is coupled to control electrodes of said second bias transistor and said current setting transistor.

8. A low offset transconductance amplifier, in an analog electronic cochlea including a plurality of serially coupled transmission line stages, comprising:

a first and a second transistor, having serially connected main conduction paths;

a third and a fourth transistor, having serially connected main conduction paths, connected in parallel with said main conduction paths of said first and second transistors;

a fifth transistor, having a main conduction path serially connected with said parallel connection of said first, second, third and fourth transistors between a source of operating potential and a source of reference potential;

a sixth and a seventh transistor, having serially connected main conduction paths between said source of operating potential and said source of reference potential;

an eighth, a ninth and a tenth transistor having serially connected main conduction paths coupled between said source of operating potential and said source of reference potential;

an eleventh and a twelfth transistor having serially connected main conduction paths coupled between said source of operating potential and said source of reference potential; wherein:

the junction of said main conduction paths of said first and second transistor is coupled to control electrodes of said first and sixth transistors;

the junction of said main conduction paths of said third and fourth transistors is coupled to control electrodes of said third and eighth transistors;

the junction of said main conduction paths of said ninth and tenth transistors is coupled to control electrodes of said seventh and tenth transistors;

the junction of said main conduction paths of said eleventh and twelfth transistors is coupled to control electrodes of said eighth and eleventh transistor;

a source of bias signal is coupled to control electrodes of said fifth and twelfth transistors;

an input terminal is coupled to a control electrode of said fourth transistor;

the junction of said main conduction paths of said sixth and seventh transistors is coupled to an output terminal, and to a control electrode of said fourth transistor.

9. In an analog electronic cochlea including a plurality of serially coupled transmission line stages, wherein each transmission line stage operates as a second-order low pass filter section and includes a low transconductance amplifier therein, the improvement wherein said low transconductance amplifier comprises:

first and second differentially connected input transistors;

an output current source transistor;

an output current sink transistor;

first means for inducing a current in said output current source transistor in response to said first input transistor; and second means for inducing a current in said output current sink transistor in response to said second input transistor, including a cascode transistor, wherein said second current inducing means comprises:

a first current mirror for coupling said second input transistor to a first current path;

said cascode transistor, having a main conduction path coupled in said first current path; and a second current mirror for coupling said current path to said output current sink transistor.

* * * * *